(12) United States Patent
Jacobs et al.

(10) Patent No.: US 9,865,760 B1
(45) Date of Patent: Jan. 9, 2018

(54) SOLAR ENERGY COLLECTING APPARATUS AND METHOD

(71) Applicant: MicroGlo, LLC, Boynton Beach, FL (US)

(72) Inventors: William A. Jacobs, Lake Worth, FL (US); Allen D. Hertz, Boca Raton, FL (US); Michael K. Tam, Lake Worth, FL (US)

(*) Notice: Subject to any disclaimer, the term of this patent is extended or adjusted under 35 U.S.C. 154(b) by 912 days.

(21) Appl. No.: 13/682,718

(22) Filed: Nov. 20, 2012

Related U.S. Application Data

(63) Continuation-in-part of application No. 12/549,348, filed on Aug. 27, 2009, now Pat. No. 8,314,328.

(60) Provisional application No. 61/114,053, filed on Nov. 12, 2008.

(51) Int. Cl.
*H01L 31/042* (2014.01)
*H01L 31/052* (2014.01)

(52) U.S. Cl.
CPC ................................. *H01L 31/052* (2013.01)

(58) Field of Classification Search
CPC ............... H01L 31/00; H01L 27/14629; H01L 31/02327; H01L 31/0521; H01L 31/0547
See application file for complete search history.

(56) References Cited

U.S. PATENT DOCUMENTS

| 5,221,363 A * | 6/1993 | Gillard ................... E06B 9/264 |
| | | 136/248 |
| 5,675,487 A * | 10/1997 | Patterson ................. E06B 9/32 |
| | | 160/7 |
| 2007/0193620 A1* | 8/2007 | Hines ........................ F24J 2/06 |
| | | 136/246 |
| 2007/0251569 A1* | 11/2007 | Shan ......................... F24J 2/08 |
| | | 136/246 |
| 2008/0178927 A1* | 7/2008 | Brezoczky ...... H01L 31/035281 |
| | | 136/248 |

FOREIGN PATENT DOCUMENTS

JP 6108762 * 4/2017 ............. H02J 15/00

OTHER PUBLICATIONS

JP6108762 (Eng trans).*

* cited by examiner

*Primary Examiner* — Jeffrey T. Barton
*Assistant Examiner* — Uyen Tran
(74) *Attorney, Agent, or Firm* — Allen D. Hertz, P.A.; Allen D. Hertz

(57) ABSTRACT

A solar energy collection device includes a solar converting station housing having a concentrator for aiding in focusing the energy onto a photovoltaic material. The photovoltaic material is applied to a series of cylindrically shaped power cells. A series of the power cells are rotationally assembled to the solar energy collection device. The power cells rotate about the cell axles, providing a cooling process for the photovoltaic material. The rotation can be provided via any number of means. The series of the power cells can be built in a removable assembly, providing a power pack for the end user.

20 Claims, 11 Drawing Sheets

SOLAR ENERGY COLLECTING APPARATUS AND METHOD

RELATED US PATENT APPLICATION

This Continuation-In-Part application claims the benefit of Non-Provisional patent application Ser. No. 12/549,348 filed on Aug. 27, 2009 (issuing as U.S. Pat. No. 8,314,328), which claims priority to then Provisional U.S. Application 61/114,053, filed Nov. 12, 2008, which is incorporated in its entirety by reference herein.

BACKGROUND OF THE INVENTION

Field of the Invention

The present invention relates to a solar energy collecting apparatus, more specifically to a device and method using a plurality of photovoltaic covered cylinders being rotatably exposed to the light source.

Discussion of the Related Art

This invention relates to a solar energy power conversion and collection system. Current solar power conversion systems utilizing light concentration or amplification devices such as a magnifying lens, mirrors and the like. The light is focus upon a photovoltaic material. One of the limitations of this configuration is a constraint cause by the properties of the photovoltaic material. The material degrades when subjected to elevated temperatures.

Solar energy concentration devices are known, such as presented in the teachings of Hoffman, et al. (U.S. Pat. No. 4,356,813), Johnson (U.S. Pat. No. 4,896,656), and Rabinowitz (U.S. Pat. No. 7,133,183). Hoffman teaches a series of reflecting walls for concentrating solar energy onto a photovoltaic surface. Johnson teaches a similar concept in a different configuration.

SUMMARY OF THE INVENTION

The present invention is directed to a solar energy collection device incorporating a concentrator for aiding in focusing the energy onto the photovoltaic material. The photovoltaic material is deposited on a cylindrically shaped power cell. A plurality of the power cells is rotationally assembled to a central framework of cell axles. The power cells rotate about the cell axles, providing a cooling process for the photovoltaic material. The rotation can be provided via any number of means.

In a first aspect of the present invention, a solar energy collection device is defined comprising:
a solar converting station housing;
a light concentrating assembly that amplifies inbound light and directs the light towards solar power conversion members;
the solar power conversion members comprising:
  a power cell comprising a photovoltaic layer laminated upon a cell body;
  a plurality of power cells assembled providing a rotational motion about an cell axis along a plane that is generally perpendicular to the concentrated direction of the light; and
  a drive apparatus for rotating each of the plurality of power cells about the cell axis.
In a second aspect, the solar energy collection device is defined comprising:

a support element;
a solar power converter support panel rotationally coupled to the support element about a rotational axis, the solar power converter support panel comprising:
  a first curved segment extending between the rotational axis and a first solar power converter support panel end,
  a second curved segment extending between the rotational axis and a second, opposite solar power converter support panel end,
  wherein an arch of the first curved segment is oriented in an opposite direction of an arch of the second curved segment; and
  a rotational drive system providing rotational motion to the solar power converter support panel,
  wherein, in operation, the solar power converter support panel rotates between a position exposing a portion of said photovoltaic material to solar energy for a first period of time and into a position obscuring said portion of said photovoltaic material from said solar energy for a second period of time.

Yet another aspect the rotational motion is continuous.
Yet another aspect the rotational motion is controlled by a computer controller.
Yet another aspect the rotational motion alternates between being stationary and rotating.
Yet another aspect the rotational motion is programmed to remain stationary over a period of time.
Yet another aspect incorporates a battery within the power cell.
Yet another aspect provides a rotational means to the power cells via rotating an assembly. The rotation causes the power cells to rotate via any of the following:
  a. a gear configuration engaging directly with each cell,
  b. friction between each cell and a second object,
  c. moving the cell while in contact with a second object, and
  d. moving the second object while in contact with the cell.
Yet another aspect incorporates an electromagnet within at least one power cell.
Yet another aspect incorporates a power storage device, such as a battery, a capacitor, and the like within at least one power cell.
Yet another aspect incorporates side supports located against a side region of each of the pressure vessels, thus limiting the expansion under pressure to a linear dimension, compared to a radial expansion.
Yet another aspect provides a removable power cell assembly providing a portable power source and a respective solar recharging station.
In another aspect, the station incorporates a fan for cooling the non-solar side of the power cells.
In another embodiment of the present invention, a method for converting solar energy to electrical energy comprises steps of:
installing a solar power converting station, the solar power converting station comprising:
  a support element,
  a rotating member rotationally carried by said support element,
  photovoltaic material applied to an outer surface of said rotating member, and
  a rotational drive system engaged with said rotating member, wherein in use, said rotational drive system rotates said rotating member;
rotating said rotating member into a position exposing a portion of said photovoltaic material to solar energy for a first period of time and rotating said rotating member into a position obscuring said portion of said photovoltaic material from said solar energy for a second period of time.

These and other features, aspects, and advantages of the invention will be further understood and appreciated by those skilled in the art by reference to the following written specification, claims and appended drawings, which follow.

BRIEF DESCRIPTION OF THE DRAWINGS

For a fuller understanding of the nature of the present invention, reference should be made to the accompanying drawings in which.

Like reference numerals refer to like parts throughout the several views of the drawings.

DETAILED DESCRIPTION OF REPRESENTATIVE EMBODIMENTS

Figure 1:
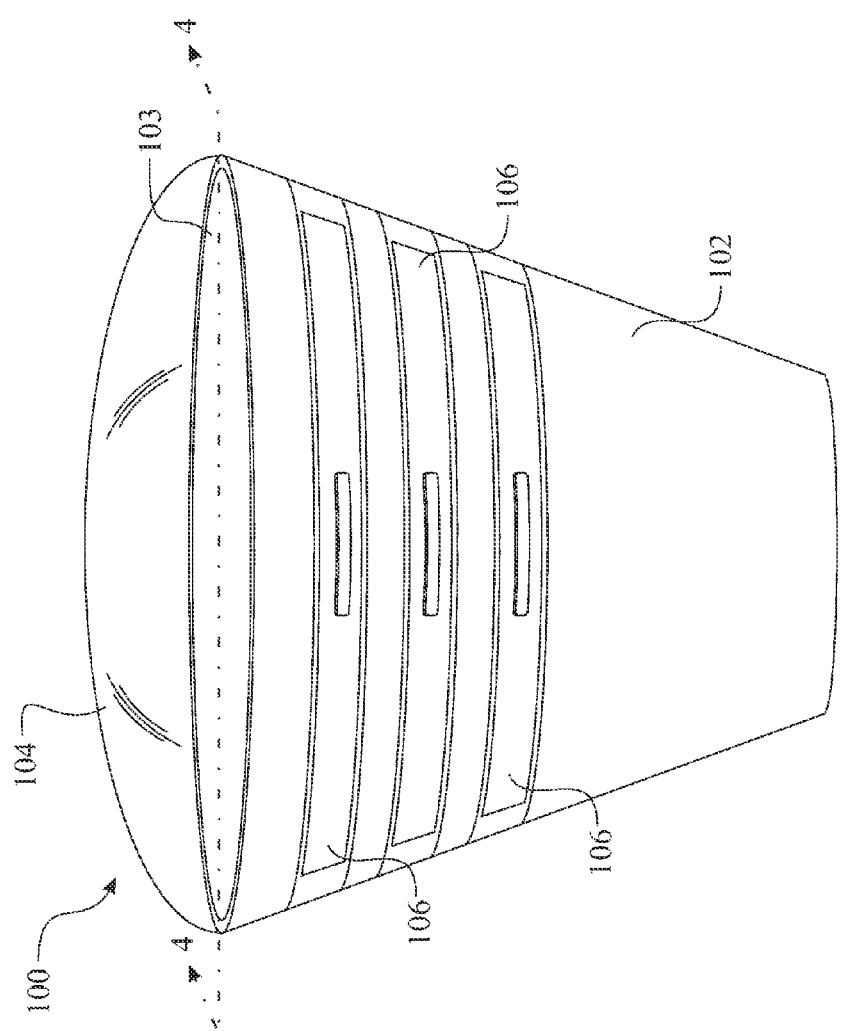
FIG. 1 presents an isometric view of an exemplary embodiment of a solar power collecting station.
Figure 2:
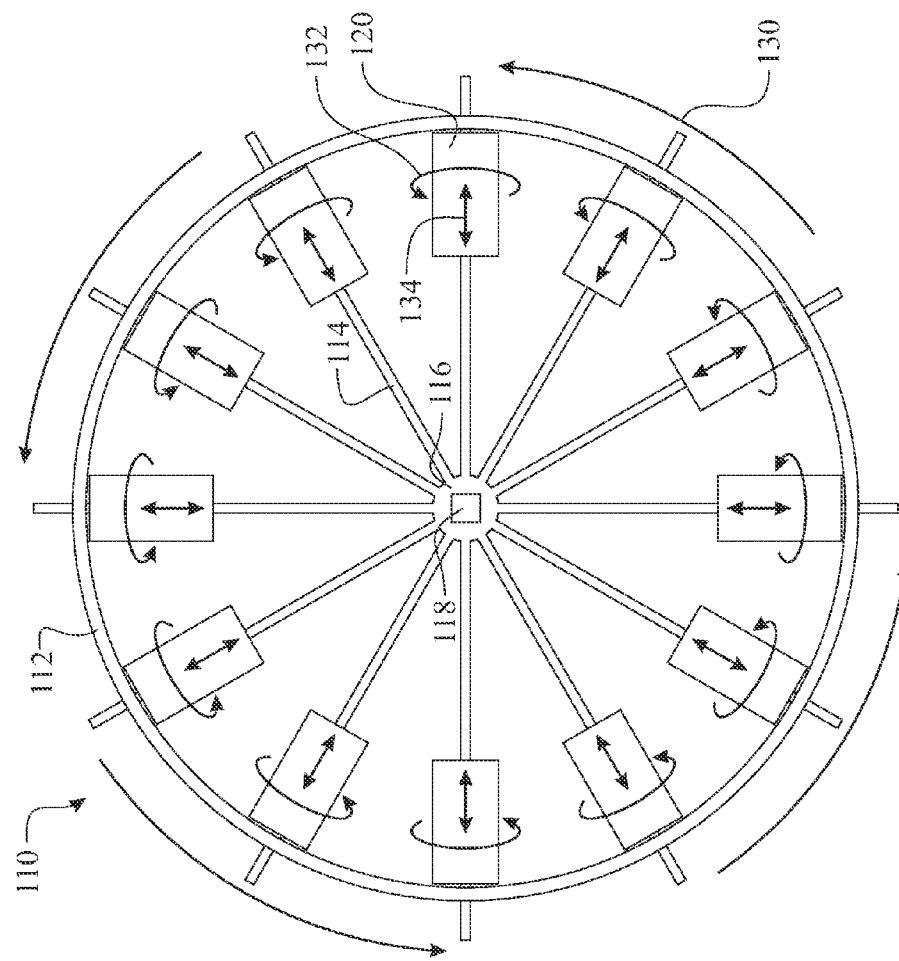
FIG. 2 presents a top planar view of an exemplary embodiment of a power cell assembly for use in conjunction with the solar power collecting station of FIG. 1.

For purposes of description herein, the terms "upper", "lower", "left", "rear", "right", "front", "vertical", "horizontal", and derivatives thereof shall relate to the invention as oriented in FIG. 1. However, one will understand that the invention may assume various alternative orientations and step sequences, except where expressly specified to the contrary. Therefore, the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 3:
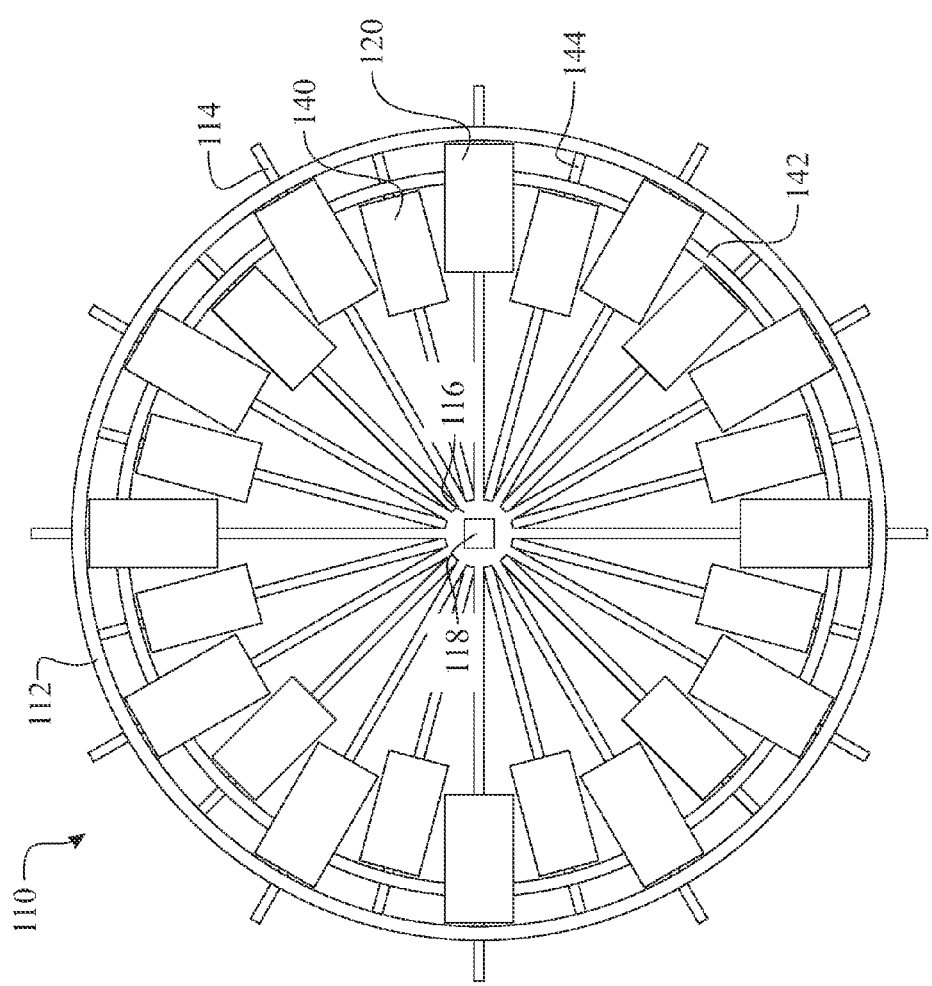
FIG. 3 presents a top planar view of a plurality of power cell assemblies.
Figure 4:
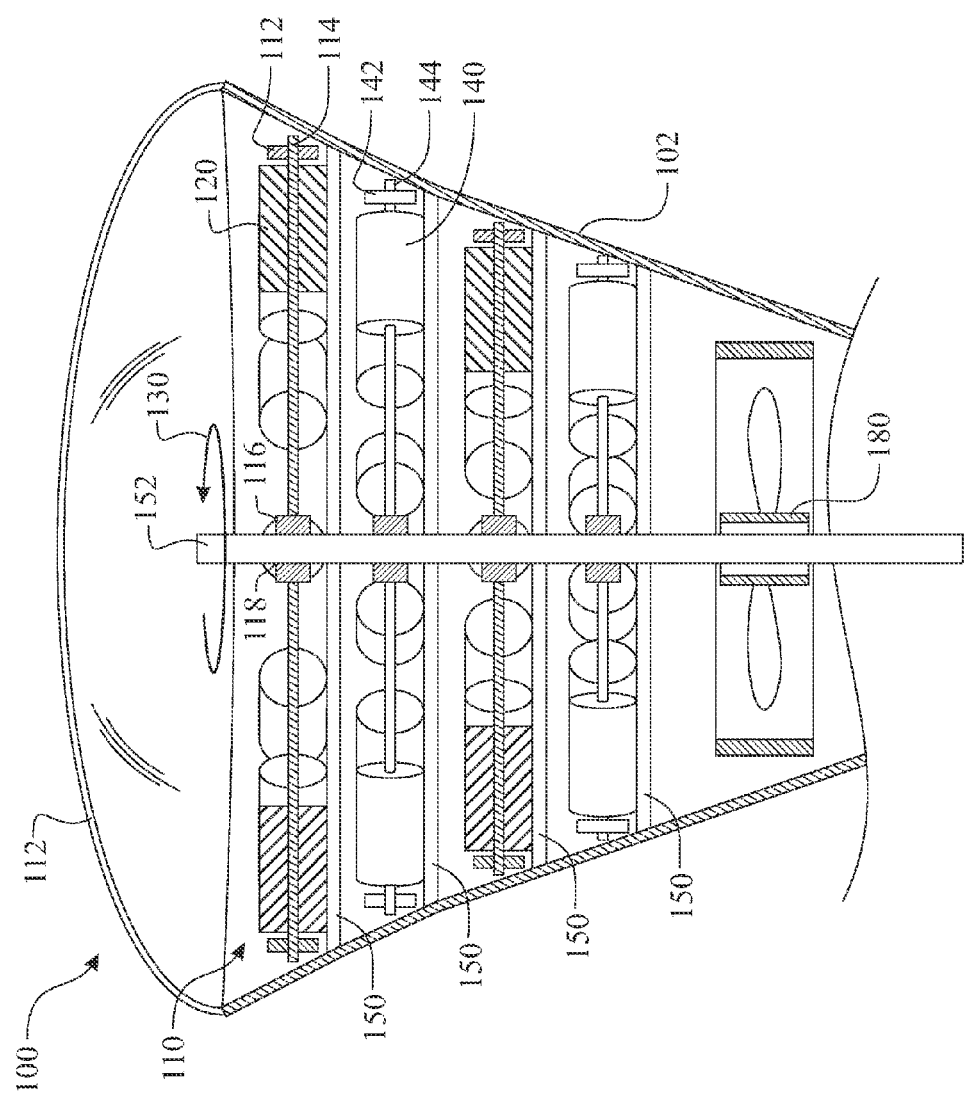
FIG. 4 presents a sectional view of the exemplary solar power collecting station taken along section 4-4 of FIG. 1.
Figure 5:
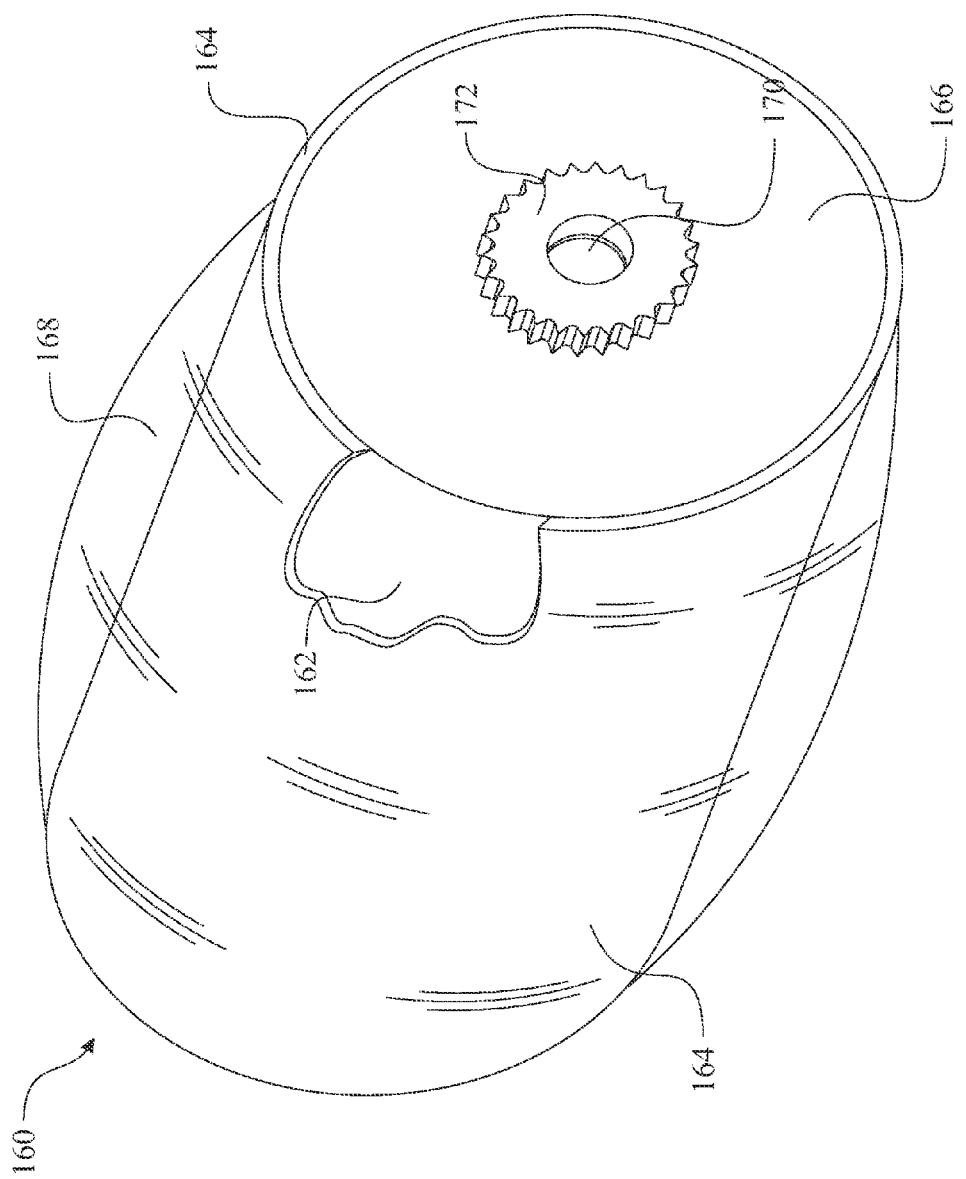
FIG. 5 presents an isometric view of a power cell assembly incorporating a single light concentrator.

An exemplary embodiment of the present invention is referred to as a solar power converting station 100 and illustrated in FIGS. 1 through 4, with a detailed view of an enhanced power cell assembly 160 presented in FIG. 5. The solar power converting station 100 comprises a solar converting station housing 102 having an upper opening 103 spanning across the upper region. The solar power converting station 100 preferably incorporates a light concentration component 104 at least partially covering the upper opening 103. The light concentration component 104 can be of any known or inventive configuration for concentrating the presented light onto the solar receptacles. Although the illustrative embodiment is a magnifying lens, it is recognized that mirrors, a series of mirrors, a combination of mirrors and lenses, and the like can be utilised.

The solar power converting station 100 incorporates at least one power cell assembly 110. The power cell assembly 110 is an assembly comprising at least one solar collecting power cell 120 rotatably assembled to a cell axle 114. The power cell assembly 110 can be formed having a plurality of cell axles 114 arranged radially spanning between a central axles hub 116 and a pack external frame 112. A solar collecting power cell 120 can be rotatably assembled to each of the cell axles 114. A central shaft engaging port 118 can be provided in the center of the central axles hub 116. The central shaft engaging port 118 engages with a central shaft 152, wherein the central shaft 152 provides a rotational force to the power cell assembly 110 directing the power cell assembly 110 to rotate in accordance with an assembly rotation 130. The solar collecting power cell 120 are in contact with a optional drive plate 150, with the friction causing the solar collecting power cell 120 to rotate about the cell axles 114 in accordance with a power cell rotation 132. This motion exposes an upper surface of the solar collecting power cell 120 to the incoming light, placing a lower surface facing a cooling fan 180.

The photovoltaic material applied to the exterior of the solar collecting power cell 120 converts solar energy to electrical energy. Each of the solar collecting power cells 120 would be in electrical communication with a power outlet interface. The electrical energy can be distributed through an electrical connection to a power storage device such as a battery, transferred to a power grid, or combination therein. An exemplary configuration incorporates a battery within each solar collecting power cell 120. The power cell assembly 110 can be removable, such as via a power pack drawer 106, becoming a power pack for use with other electronically driven devices. Additionally, the designer can incorporate an electro-magnet within the solar collecting power cell 120, utilising the rotating motion to generate additional electrical energy. It is understood that additional electrical power control components such as fuses, circuit breakers, and the like can be incorporated for power management and safety.

One exemplary embodiment of the power cell assembly 110 is presented herein. It is understood that the optional drive plate 150 can rotate, while the power cell assembly 110 remains stationary. The optional drive plate 150 and the power cell assembly 110 can both rotate, each rotating at a different speed and/or direction respective to each other. Alternately, the solar collecting power cell 120/enhanced power cell assembly 160 can include a rotational drive gear 172 or other means driving the rotation of the solar collecting power cell 120 about the cell axles 114. The cell axles 114 can be of any form factor or other coupling interface to the pack external frame 112. The illustrated embodiment allows the solar collecting power cell 120 to adjust longitudinally, in accordance with a power cell radial motion 134. The cell axles 114 can be telescoping allowing the power cell assembly 110 to collapse inwardly for storage or reduction of the cross sectional area for protection during storms or other potentially damaging conditions.

The optional drive plate 150 can be of any material and form factor, preferably being porous and of a material or fabrication allowing the solar energy 399 to transmit through.

In the preferred embodiment, the solar power converting station 100 incorporates a plurality of power cell assembly 110 oriented in a stacked configuration as presented in FIGS. 3 and 4. It is preferred to align each power cell assembly 110 with the solar collecting power cell 120, 140 offset from each other optimizing exposure to the inbound light. The upper power cell assembly 110 comprising the components as previously described. The adjacent lower power cell assembly 110 comprising similar components, referenced as a secondary power cell 140, secondary pack external frame 142, and a secondary cell axles 144. Each power cell assembly 110 would have a different diameter compared to the adjacent power cell assembly 110. The diameter can be smaller as the layers continue towards the base or increasing forming an inverted cone.

Figure 6:
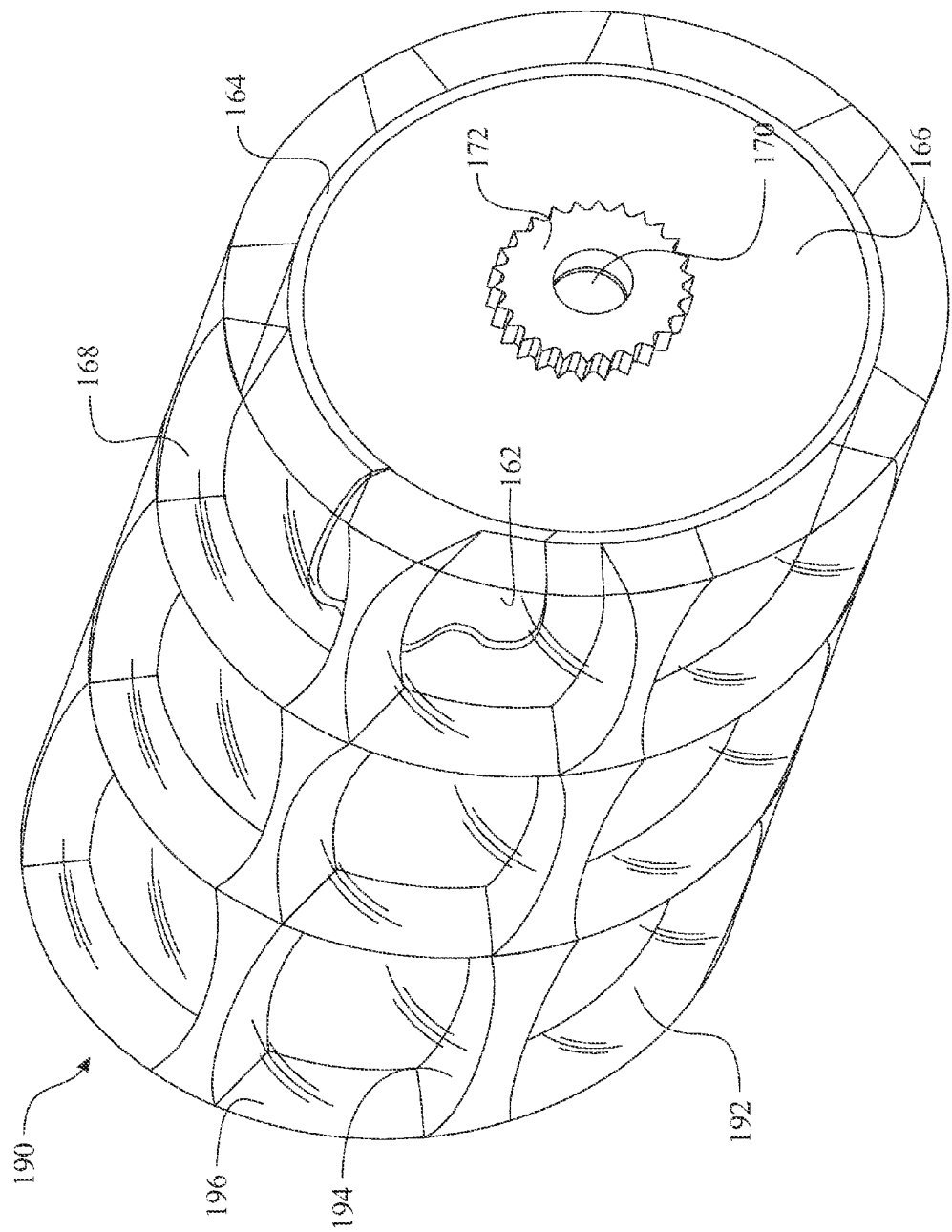
FIG. 6 presents an isometric view of a power cell assembly incorporating a plurality of light concentrators.

The solar collecting power cell 120, 140 can include the features illustrated in an enhanced power cell assembly 160 as illustrated in FIGS. 5 and 6. The enhanced power cell assembly 160 is fabricated having a cylindrically shaped power cell body 162. A body end walls 166 can be provided on each end of the cylindrically shaped power cell body 162. A photovoltaic layer 164 is laminated to the exterior surface of the cylindrically shaped power cell body 162. A cell axis 170 is formed through at least one body end walls 166 and projects inward or completely through the cylindrically shaped power cell body 162. An optional cell magnifying layer 168 can be provided coating the exterior of the cell magnifying layer 168 (FIG. 5) providing additional concentration of the inbound light. Alternately, a concentrator can be assembled to the power cell assembly 110 between the light source and each solar collecting power cell 120 in addition to the light concentration component 104. Yet another concentrator can utilise tapered fibers. While another exemplary concentrating configuration can use a plurality of magnifying plates 192. The magnifying plates 192 are assembled to the enhanced power cell assembly 190 via a grid having a series of circumferential magnifier support ribs 196 arranged circumferentially and a series of longitudinal magnifier support members 194 arranged axially. The walls of the longitudinal magnifier support members 194 and circumferential magnifier support ribs 196 can have a finish to help reflect the light towards the photovoltaic layer 164. One example would be a mirrored finish. An optional rotational drive gear 172 can be provided at one end of the enhanced power cell assembly 160 for interfacing with a drive mechanism directing the enhanced power cell assembly 160 to rotate in accordance with the power cell rotation 132. Alternate rotational interfaces and drive mechanisms can be utilised, such as a "Lazy Susan" style bearing ring, and the like.

Figure 8:
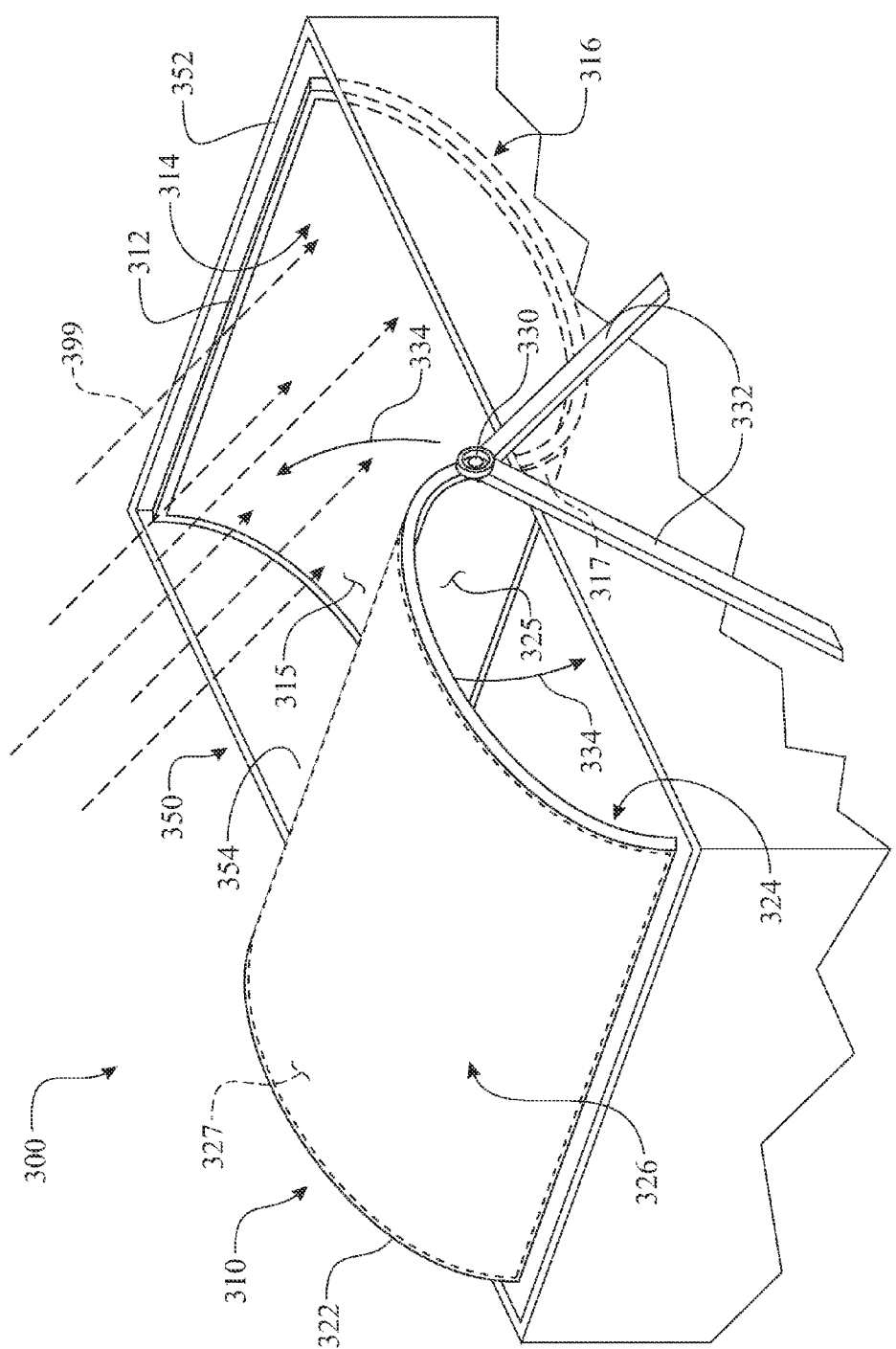
FIG. 8 presents an isometric view of an exemplary solar power converting station comprising a solar power converter support panel formed having a convex surface on a first side of a rotational axis and a concave surface on a second side of the rotational axis.

The concept of rotating the photovoltaic material between a light/solar energy exposed configuration and a light/solar energy avoidance configuration is adapted to a solar power converting station 300 as illustrated in FIG. 8. The solar power converting station 300 comprises a solar power converter support panel 310 rotationally supported by a rotational axis and controller 330. The solar power converter support panel 310 is segmented in to a first panel segment 312 extending between the rotational axis and controller 330 and a first distal edge of the solar power converter support panel 310 and a second panel segment 322 extending between the rotational axis and controller 330 and a second, opposite distal edge of the solar power converter support panel 310. Each of the segments 312, 322 is shaped having a concave surface 314, 324 on a first side of each panel segment and a convex surface 316, 326 on the opposite side of each panel segment. The segments 312, 322 are arranged wherein the concave surface 314 of the first panel segment 312 is continuous with the convex second panel surface 326 of the second panel segment 322, and similarly, the concave surface 324 of the second panel segment 322 is continuous with the convex first panel surface 316 of the first panel segment 312. A first panel concave photovoltaic laminate 315 is laminated upon the concave first panel surface 314 of the first panel segment 312. An optional first panel convex photovoltaic laminate 317 can be laminated upon the convex first panel surface 316 of the first panel segment 312. A second panel concave photovoltaic laminate 325 is laminated upon the concave second panel surface 324 of the second panel segment 322. An optional convex photovoltaic laminate 327 can be laminated upon the convex second panel surface 326 of the second panel segment 322. The photovoltaic laminates 315, 317, 325, 327 are provided in electrical communication with a power management system (not shown, but well understood) by an electrically conductive material, such as wires.

The solar power converter support panel 310 is rotationally supported by the rotational axis and controller 330. The rotational axis and controller 330 includes or is in operational communication with a rotational drive mechanism, such as a motor, pulley, gears, transmission, and the like. The rotational axis and controller 330 is supported by a support frame 332. It is understood that the support frame 332 can be provided in any suitable form factor to adequately support the solar power converter support panel 310.

The solar power converting station 300 can include a solar converting station casing 350 surrounding the solar power converter support panel 310. The solar converting station casing 350 comprises a plurality of solar converting station casing side panels 352. The solar converting station casing interior surfaces 354 of the solar converting station casing side panels 352 form and interior volume. The solar power converter support panel 310 is located within the interior volume of the solar converting station casing 350. The solar converting station casing side panels 352 are preferably fabricated of a light impervious material, wherein light/solar energy 399 is obscured when the respective surface of the segment is facing an interior of the solar converting station casing 350. In the exemplary illustration in FIG. 8, the first panel convex photovoltaic laminate 317 and the second panel concave photovoltaic laminate 325 are positioned within the interior volume of the solar converting station casing 350. In this position, the first panel concave photovoltaic laminate 315 and optional convex photovoltaic laminate 327 are exposed to and subjected to inbound solar energy 399. The exposure elevates the temperature of the photovoltaic laminate 315, 327. The elevated temperature reduces the efficiency and lifespan of the photovoltaic laminate 315, 317, 325, 327. The rotation of the solar power converter support panel 310 divides the exposure of the photovoltaic laminate 315, 317, 325, 327 to solar energy 399 to half of the time. During one portion of a full rotation of the solar power converter support panel 310, the photovoltaic laminates 315, 327 are exposed to the solar energy 399, while the photovoltaic laminates 325, 317 are obscured from the solar energy 399. It is understood that a cooling system can be integrated in the solar converting station casing 350, wherein the cooling system reduces the temperature of the obscured photovoltaic laminates 325, 317. The concave shape of the first panel concave photovoltaic laminate 315 aids in directing the solar energy 399 to optimize the efficiency of the system. The convex photovoltaic laminate 327 is optional, wherein the inclusion of the convex photovoltaic laminate 327 utilises the available surface area.

The solar power converter support panel 310 continues to rotate in accordance with the panel rotational motion 334, alternating between sides of the solar power converter support panel 310 being exposed to the solar energy 399. During a second portion of the full rotation, the photovoltaic laminates 315, 327 are obscured from the solar energy 399. Placing the photovoltaic laminates 315, 327 within the interior volume of the solar converting station casing 350 aids in obscuring the photovoltaic laminates 315, 327 from the solar energy 399.

It is understood that the solar converting station casing 350 can be fabricated by forming a recess in the earth, a cavity within a building, and the like.

Figure 9:
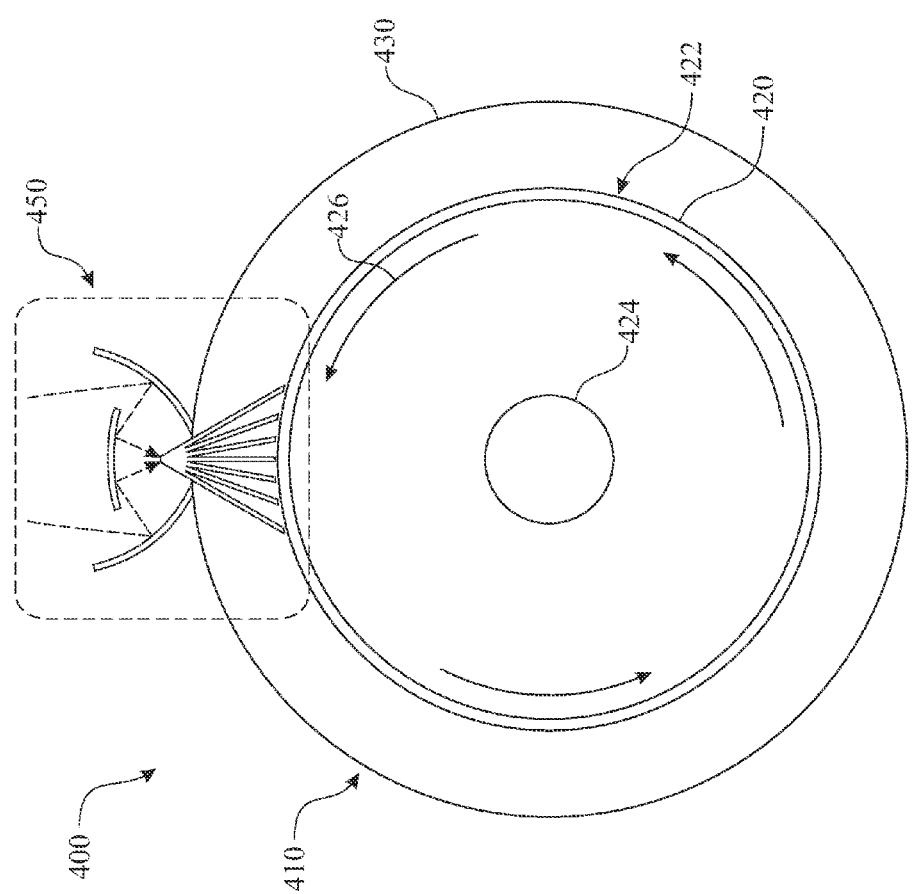
FIG. 9 presents a side sectioned view of an exemplary light concentrator directing concentrated light onto an exemplary rotational photovoltaic drum.
Figure 10:
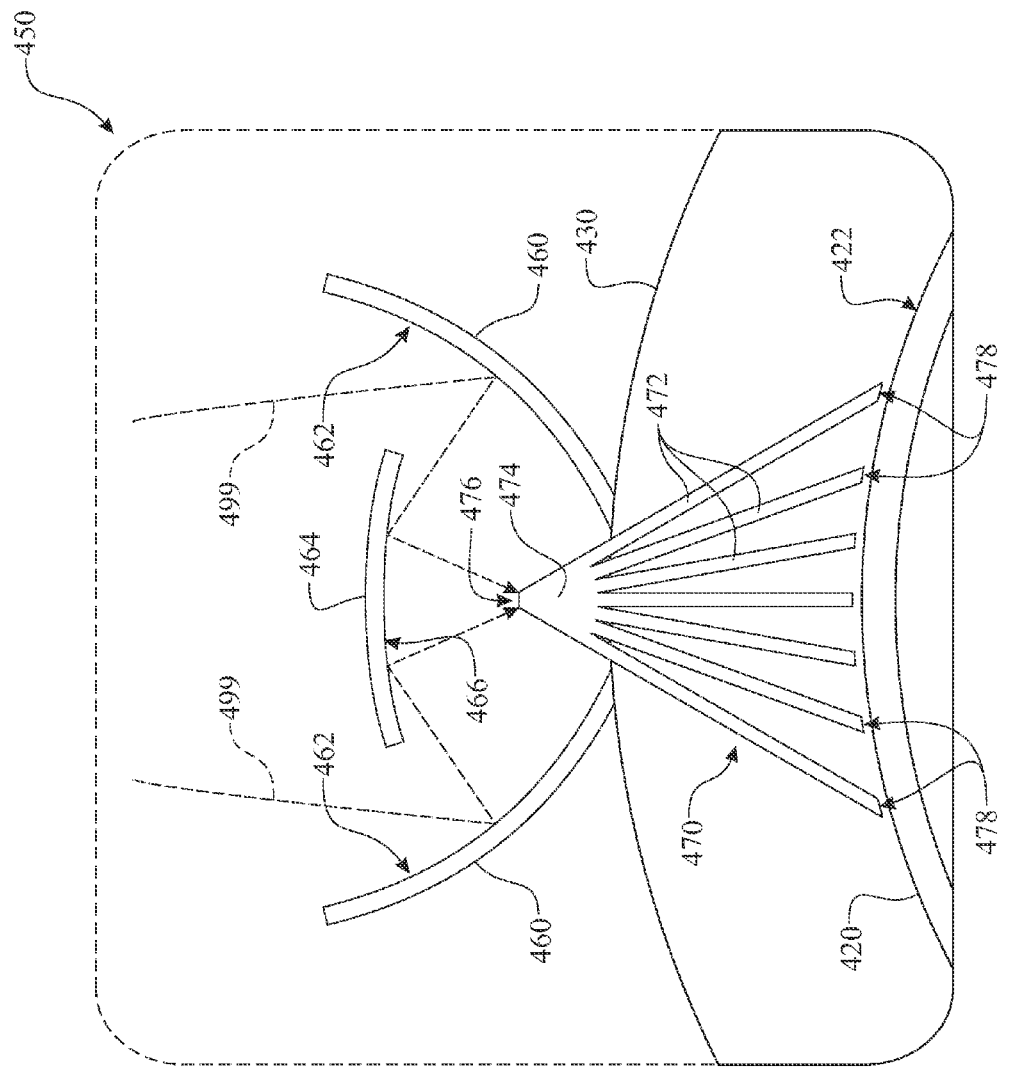
FIG. 10 presents an enlarged side sectioned view of the exemplary light concentrator.

The concept of limiting exposure of the photovoltaic material to the solar energy 399 can be provided by continuously rotating the photovoltaic material across an area of concentrated solar energy, as referred to as a concentrating solar power converting station 400 and presented in the exemplary embodiment illustration in FIGS. 9 and 10. The concentrating solar power converting station 400 is fabricated having a photovoltaic drum 420 rotationally assembled to a support frame by a drum central axis 424 within a rotational drum housing 430 forming a rotational drum assembly 410. The support frame is assembled to a rotational drum housing 430. The photovoltaic drum 420 is rotated in accordance with a panel rotational motion 426 by a rotational drive system. A photovoltaic material 422 laminated is upon an exposed, outer surface of a photovoltaic drum 420. The concentrating solar power converting station 400 includes a light source concentrator 450, which focuses solar energy 499 into a small area of the photovoltaic material 422. The rotational drum housing 430 can be positioned to optimize alignment of the light source concentrator 450 to the inbound solar energy 499 using any known positioning system. It is understood that the preferred positioning system includes automated positioning equipment.

The light source concentrator 450 utilizes a series of reflecting surfaces to redirect, concentrate, and deliver the solar energy 499 to a light collimator 470. The light collimator 470 disburses the concentrated solar energy 499 across a section of the photovoltaic material 422. The light collimator 470 is fabricated having a series of light pipes 472 extending in a fanned out fashion from a light pipe entry bundle 474. The light pipes 472 can be provided in any form factor of any suitable material, including composites, plastic, glass, fiber optics, and the like. A light pipe entry bundle source surface 476 is formed at a proximal end of the light collimator 470. The series of reflecting surfaces can utilise any suitable material or combination of materials formed into any suitable shape to redirect and concentrate inbound solar energy 499. The exemplary embodiment utilizes a light reflective surface 462 applied upon a parabolic light reflecting concentrator 460 to redirect the solar energy 499 to a light source director 464. The light is redirected by a light source director reflective surface 466 of the light source director 464 towards the light pipe entry bundle source surface 476. The redirected, concentrated solar energy is transferred to the light collimator 470, entering through a light pipe entry bundle source surface 476 formed at a proximal end thereof. In operation, the light collimator 470 disburses the solar energy 499 across a segment of the photovoltaic material 422 through a plurality of 472. The solar energy 499 exits through the light pipe entry bundle discharge surface 478 of the distal end of each respective light pipe 472. The photovoltaic material 422 converts the solar energy 499 into electrical energy, which is transferred through one or more electrical conduits to an electrical energy collector, an electrically powered device, and the like.

It is noted that a layer of photovoltaic material can be applied to the exposed surface of the light source director 464 to optimize the useable surface area for the conversion of solar energy 499 to electrical energy.

The rotation of the photovoltaic drum 420 limits a time span when the photovoltaic material 422 is exposed to the solar energy 499, thus controlling the temperature. The controlled thermal exposure increases the efficiency and lifespan of the photovoltaic material 422.

Figure 11:
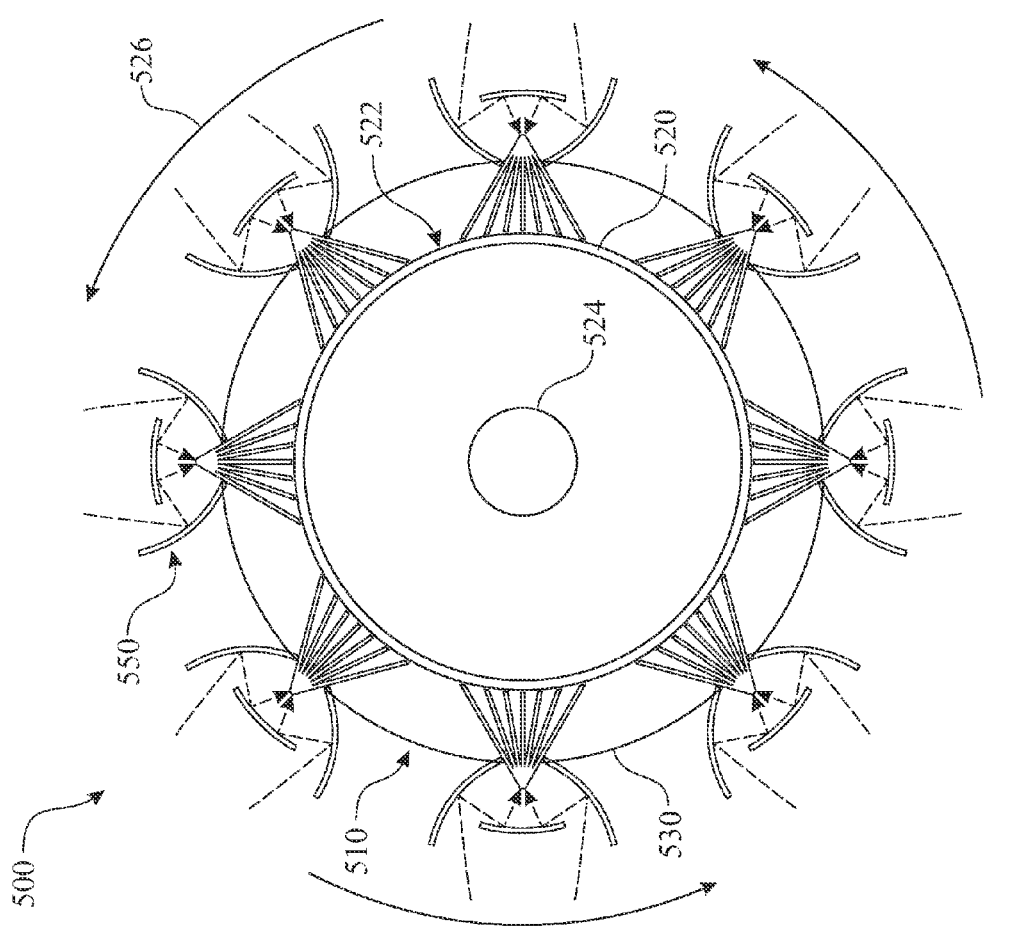
FIG. 11 presents a side sectioned view of an exemplary light concentrator directing concentrated light onto an exemplary rotational photovoltaic drum.

In contrast, the concentrating solar power converting station 400 can be modified to include a series of light source concentrators 450, creating a concentrating solar power converting station 500, as illustrated in FIG. 11. A majority of the elements of the concentrating solar power converting station 500 are similar to the elements of the concentrating solar power converting station 400, wherein like features of the concentrating solar power converting station 500 and the concentrating solar power converting station 400 are numbered the same except preceded by the numeral '5'. The distinctive differences are described as follows. The concentrating solar power converting station 500 includes a series of spatially arranged light source concentrators 550, wherein the light source concentrator 550 is like the light source concentrator 450 as previously described. In this embodiment, the entire assembly rotates in accordance with a panel rotational motion 526. The rotation limits the time span in which each light source concentrator 550 is aligned with the incoming solar energy 499, thus controlling the thermal exposure of the photovoltaic material 522, resulting in the same benefits as previously described.

It is recognized that a solar power converting station 100 can be of any of a variety of form factors and details incorporating the same generic concept. Concentrated light energy, which is focused onto a photovoltaic material causing the temperature of the photovoltaic material to increase. This present invention provides the photovoltaic material on a cylindrical body that rotates. The rotation step positions a portion of the photovoltaic material for receiving the light and the remainder of the photovoltaic material is positioned for cooling. The rotation can be provided in any reasonable means suggested by one skilled in the art.

Figure 7:
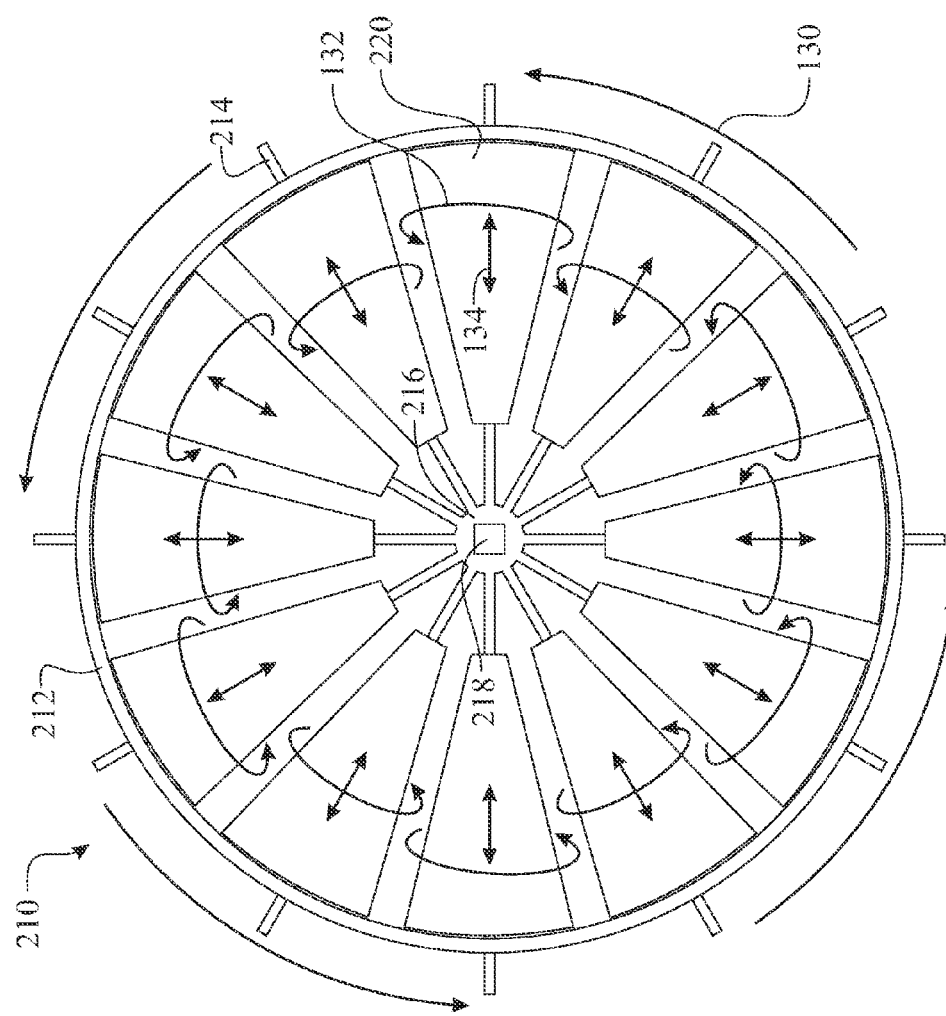
FIG. 7 presents a top planar view of an alternate exemplary power cell assembly.

To provide improved efficiency, the solar power converting station 100 can employ a series of layers of the power cell assembly 110. Alternately, the solar cell assemblies 220 can be formed having a taper as illustrated in FIG. 7. The conical or tapered shape provides a denser distribution of the photovoltaic material across the assembly. The dense power cell assembly 210 would comprise features as described previously, including a pack external frame 212, a cell axles 214, a central axles hub 216, and a central shaft engaging port 218. The optional drive plate 150 could be formed having an angled contacting surface, ensuring continuous contact between the optional drive plate 150 and the conical solar collecting power cell 220.

In summary, the various embodiments are based upon the same principle, wherein a photovoltaic material is carried by a rotating element. The rotation limits the time of exposure of the solar energy up the photovoltaic material. The limited and controlled exposure increases the efficiency and extends the lifespan of the photovoltaic material.

The above description is considered that of the preferred embodiments only. Modifications of the invention will occur to those skilled in the art and to those who make or use the invention. Therefore, it is understood that the embodiments shown in the drawings and described above are merely for illustrative purposes and are not intended to limit the scope of the invention, which is defined by the following claims as interpreted according to the principles of patent law, including the doctrine of equivalents.

We claim:

1. A method of converting solar power to electrical power, the method comprising steps of:
    installing a solar power converting station, the solar power converting station comprising:
        a support element,
        a rotating member rotationally carried by said support element,
        photovoltaic material applied to an outer surface of said rotating member, the photovoltaic material comprising a first portion and a second portion, and
        rotational drive system engaged with said rotating member, wherein in use, said rotational drive system rotates said rotating member in a complete 360 degree rotation;
    rotating said rotating member into a position exposing said first portion of said photovoltaic material to solar energy for a first period of time, wherein said first portion of said photovoltaic material is rotated into said exposed position to generate electrical power, while said second portion of said photovoltaic material is rotated into a position that is obscured from said solar energy to cool said second portion of said photovoltaic material, and
    rotating said rotating member approximately 180 degrees from the position where said first portion of said photovoltaic material is exposed to said solar energy, wherein said first portion of said photovoltaic material is obscured from exposure to said solar energy for a second period of time and said second portion of said photovoltaic material is rotated into a position exposing said second portion of said photovoltaic material to said solar energy to generate electrical power, wherein said first portion of said photovoltaic material is rotated into said obscured position to cool said first portion of said photovoltaic material, and
    continuing to rotate the rotating member in the same direction approximately 180 degrees returning said rotating member into the position exposing said first portion of said photovoltaic material to solar energy.

2. A method of converting solar power to electrical power as recited in claim 1, the method further comprising a step of concentrating solar energy towards said photovoltaic material.

3. A method of converting solar power to electrical power as recited in claim 1, the method further comprising a step of rotating said rotating member at a constant velocity.

4. A method of converting solar power to electrical power as recited in claim 1, the method further comprising a step of rotating said rotating member at a variable velocity.

5. A method of converting solar power to electrical power as recited in claim 4, the step of rotating said rotating member at a variable velocity further comprises a step of maintaining the rotating member at one position over a period of time.

6. A method of converting solar power to electrical power as recited in claim 1, the method further comprising a step of cooling the obscured portion of the photovoltaic material by forcing air across the obscured portion of the photovoltaic material.

7. A method of converting solar power to electrical power as recited in claim 1, the method further comprising a step of enhancing obscuring said solar energy by locating said rotating member within an enclosure, wherein the portion of the photovoltaic material obscured from the solar energy is located at least partially within said enclosure.

8. A method of converting solar power to electrical power, the method comprising steps of:
    installing a solar power converting station, the solar power converting station comprising:
        a support element,
        a solar power converter support panel rotationally carried by said support element about a rotational axis, the solar power converter support panel comprising:
            a first curved segment extending between the rotational axis and a first solar power converter support panel end,
            second curved segment extending between the rotational axis and a second, opposite solar power converter support panel end,
        wherein an arch of the first curved segment is oriented in an opposite direction of an arch of the second curved segment, wherein the arch of the first curved segment has a radial center distally outward from a first side of the solar power converter support panel and the arch of the second curved segment has a radial center distally outward from a second side of the solar power converter support panel defining an S-shaped cross section;
        photovoltaic material applied to an outer surface of said solar power converter support panel, the photovoltaic material comprising a first portion and a second portion, and
        a rotational drive system engaged with said solar power converter support panel, wherein in use, said rotational drive system rotates said solar power converter support panel;
    rotating said rotating member into a position exposing said first portion of said photovoltaic material to solar energy for a first period of time, wherein said first portion of said photovoltaic material is rotated into said exposed position to generate electrical power, while said second portion of said photovoltaic material is in a position that is obscured from said solar energy to cool said second portion of said photovoltaic material, and
    rotating said rotating member into a position obscuring said first portion of said photovoltaic material from exposure to said solar energy for a second period of time and rotating said second portion of said photovoltaic material into a position exposing said second portion of said photovoltaic material to said solar energy to generate electrical power, wherein said first portion of said photovoltaic material is rotated into said obscured position to cool said first portion of said photovoltaic material.

9. A method of converting solar power to electrical power as recited in claim 8, the method further comprising a step of concentrating solar energy towards said photovoltaic material.

10. A method of converting solar power to electrical power as recited in claim 8, the method further comprising a step of rotating said solar power converter support panel at a constant velocity.

11. A method of converting solar power to electrical power as recited in claim 8, the method further comprising a step of rotating said solar power converter support panel at a variable velocity.

12. A method of converting solar power to electrical power as recited in claim 11, the step of rotating said solar power converter support panel at a variable velocity further comprises a step of maintaining the solar power converter support panel at one position over a period of time.

13. A method of converting solar power to electrical power as recited in claim 8, the method further comprising a step of cooling the obscured portion of the photovoltaic material by forcing air across the obscured portion of the photovoltaic material.

14. A method of converting solar power to electrical power as recited in claim 8, the method further comprising a step of enhancing obscuring said solar energy by locating said rotating member within an enclosure, wherein the portion of the photovoltaic material obscured from the solar energy is located at least partially within said enclosure.

15. A method of converting solar power to electrical power, the method comprising steps of:
   installing a solar power converting station, the solar power converting station comprising:
   a support element,
   a cylindrically shaped photovoltaic member rotationally carried by said support element about a rotational axis,
   photovoltaic material applied to an outer surface of said cylindrically shaped photovoltaic member, the photovoltaic material comprising a first portion and a second portion, and
   a rotational drive system engaged with said cylindrically shaped photovoltaic member, wherein in use, said rotational drive system rotates said cylindrically shaped photovoltaic member in a complete 360 degree rotation;
   rotating said rotating member into a position exposing said first portion of said photovoltaic material to solar energy for a first period of time, wherein said first portion of said photovoltaic material is rotated into said exposed position to generate electrical power, while said second portion of said photovoltaic material is rotated into a position that is obscured from said solar energy to cool said second portion of said photovoltaic material, and
   rotating said rotating member approximately 180 degrees from the position where said first portion of said photovoltaic material is exposed to said solar energy, wherein said first portion of said photovoltaic material is obscured from exposure to said solar energy for a second period of time and said second portion of said photovoltaic material is rotated into a position exposing said second portion of said photovoltaic material to said solar energy to generate electrical power, wherein said first portion of said photovoltaic material is rotated into said obscured position to cool said first portion of said photovoltaic material, and
   continuing to rotate the rotating member in the same direction approximately 180 degrees returning said rotating member into the position exposing said first portion of said photovoltaic material to solar energy.

16. A method of converting solar power to electrical power as recited in claim 15, the method further comprising a step of concentrating solar energy towards said photovoltaic material.

17. A method of converting solar power to electrical power as recited in claim 15, the method further comprising a step of rotating said cylindrically shaped photovoltaic member at a constant velocity.

18. A method of converting solar power to electrical power as recited in claim 15, the method further comprising a step of rotating said cylindrically shaped photovoltaic member at a variable velocity.

19. A method of converting solar power to electrical power as recited in claim 18, the step of rotating said cylindrically shaped photovoltaic member at a variable velocity further comprises a step of maintaining the cylindrically shaped photovoltaic member at one position over a period of time.

20. A method of converting solar power to electrical power as recited in claim 15, the method further comprising a step of cooling the obscured portion of the photovoltaic material by forcing air across the obscured portion of the photovoltaic material.

* * * * *